(12) United States Patent
Tsuda

(10) Patent No.: US 6,754,480 B1
(45) Date of Patent: Jun. 22, 2004

(54) BASEBAND ANALOG CIRCUIT WITH IMPROVED NOISE CHARACTERISTICS

(75) Inventor: Syuichi Tsuda, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/552,938

(22) Filed: Apr. 20, 2000

(30) Foreign Application Priority Data

Apr. 22, 1999 (JP) ............................................ 11-114910

(51) Int. Cl.⁷ ................................................ H04B 1/26
(52) U.S. Cl. ...................... 455/313; 455/296; 455/309; 327/310; 327/334; 333/32
(58) Field of Search ................................ 455/313, 333, 455/337, 330, 296, 309, 306; 333/32, 23; 327/310, 334, 108, 538

(56) References Cited

U.S. PATENT DOCUMENTS 5,369,470 A  *  11/1994  Hansen ........................ 455/296
5,623,514 A  *  4/1997  Arai ............................ 375/222
5,815,035 A  *  9/1998  Yamagishi et al. .......... 329/311
6,134,452 A  *  10/2000  Hufford et al. ........... 455/552.1

FOREIGN PATENT DOCUMENTS

JP          6-291560 A1        10/1994

* cited by examiner

*Primary Examiner*—Charles Appiah
*Assistant Examiner*—Khawar Iqbal
(74) *Attorney, Agent, or Firm*—Brinks Hofer Gilson & Lione

(57) ABSTRACT

A baseband analog circuit includes a demodulator to demodulate a received signal and to output a baseband analog signal, a low-pass filter to filter the demodulated baseband analog signal, and an impedance converter, provided between the demodulator and the low-pass filter, having lower output impedance than the output impedance of the demodulator.

6 Claims, 1 Drawing Sheet

BASEBAND ANALOG CIRCUIT WITH IMPROVED NOISE CHARACTERISTICS

BACKGROUND OF THE INVENTION

1. Field of the Invention

The present invention relates to a baseband analog circuit suitable as a receiver. More specifically, the present invention relates to a baseband analog circuit suitable as a receiver in, for example, a CDMA (code division multiple access) type mobile phone.

2. Description of the Related Art

A conventional baseband analog circuit 21 will be described with reference to FIG. 2. The baseband analog circuit 21 includes a demodulator 22 for demodulating an input signal into a baseband analog signal, and a low-pass filter 23 having the demodulated signal input thereto. The demodulator 22 is implemented with, for example, bipolar transistors and the output impedance thereof is high. The low-pass filter 23 is also implemented with bipolar transistors.

A transmission signal of frequency 800 MHz is received by an antenna 24 and is subsequently output to a frequency converter 25. At the frequency converter 25, the transmission signal is frequency-converted into an intermediate frequency signal having a frequency of approximately 85 MHz and is output to the demodulator 22. At the demodulator 22, the intermediate frequency signal is demodulated into a baseband analog signal and is output to the low-pass filter 23. Since the baseband analog signal demodulated at the demodulator 22 has a band up to approximately 600 kHz, the cutoff frequency of the low-pass filter 23 is approximately 600 kHz. The baseband analog signal passed through the low-pass filter 23 is output to an A/D converter (analog-to-digital converter) 26, where it is converted into a digital signal.

However, a problem exists in that the low-pass filter 23 produces noise, which decreases the C/N (carrier to noise ratio) because the input impedance of the low-pass filter 23 and the output impedance of the demodulator 22 are large. Another problem is the decrease in the N/F (noise figure) of the low-pass filter 23 because the output impedance of the demodulator 22 is larger than the equivalent noise resistance of the low-pass filter 23.

SUMMARY OF THE INVENTION

Accordingly, an object of the present invention is to solve the foregoing problems by providing a low-pass filter with improved noise characteristics.

To this end, according to a first aspect of the invention, a baseband analog circuit is provided. The baseband analog circuit includes a demodulator to demodulate a received signal and to output a baseband analog signal, a low-pass filter to filter the demodulated baseband analog signal, and an impedance converter, provided between the demodulator and the low-pass filter, having a lower output impedance than the output impedance of the demodulator.

The impedance converter may comprise an emitter-follower circuit. The output impedance of the impedance converter, and thus impedance seen by the input terminal of the low-pass filter, is decreased from the conventional receiver. Accordingly, the noise occurring at the low-pass filter is reduced thereby improving the C/N. The output impedance of the emitter-follower circuit may be not greater than the equivalent noise resistance of the low-pass filter.

The low-pass filter may comprise a complementary metal-oxide semiconductor (CMOS) circuitry.

In this manner, an inexpensive baseband analog circuit can be provided.

DESCRIPTION OF THE PREFERRED EMBODIMENT

Figure 1:
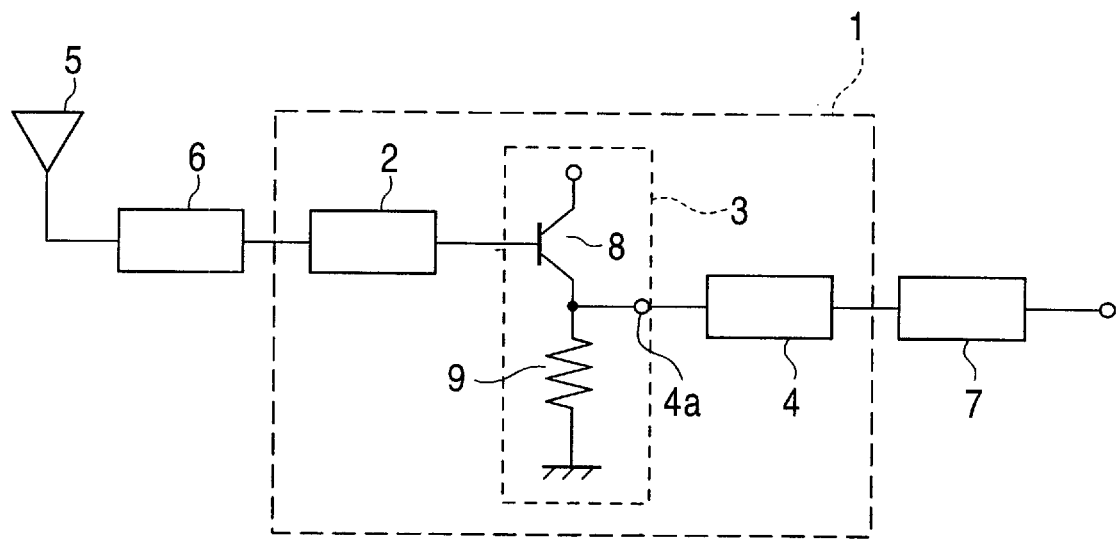
FIG. 1 is a block diagram of a baseband analog circuit according to the present invention.
Figure 2:
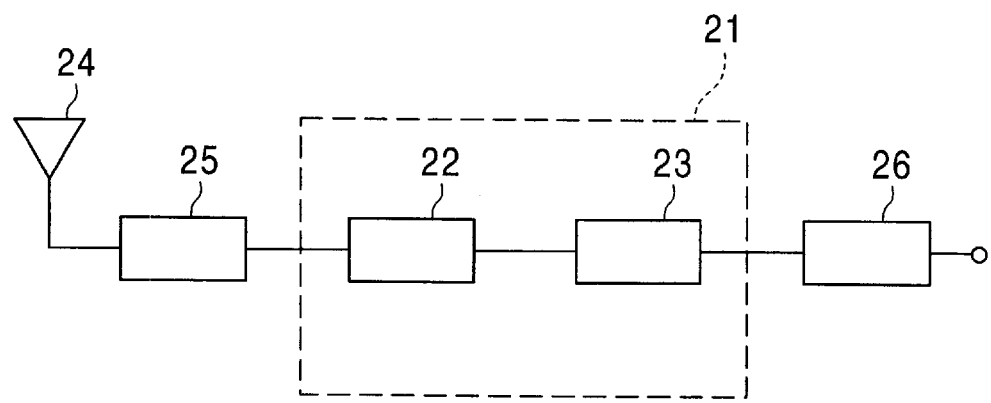
FIG. 2 is a block diagram of a conventional baseband analog circuit.

A baseband analog circuit 1 is described with reference to FIG. 1. The baseband analog circuit 1 includes a demodulator 2, an impedance converter 3, and a low-pass filter 4. The demodulator 2 may comprise, for example, CMOS (complementary metal-oxide semiconductor) circuitry, thereby producing a demodulator 2 with large output impedance. The impedance converter 3 has lower output impedance than the output impedance of the demodulator 2. The low-pass filter 4 may also comprise CMOS circuitry.

Initially, a transmission signal (frequency: 800 MHz) received at a receiving antenna 5 is frequency-converted into an intermediate frequency signal having a frequency of approximately 85 MHz at a frequency converter 6 and subsequently output to the demodulator 2. At the demodulator 2, the intermediate frequency signal is demodulated into a baseband analog signal having a maximum frequency of approximately 600 kHz and is output to the impedance converter 3. The baseband analog signal is subsequently output to the low-pass filter 4 via the impedance converter 3. The low-pass filter 4 has a cutoff frequency of approximately 600 kHz and filters the baseband analog signal such that frequencies above the cutoff frequency are attenuated. The filtered baseband analog signal outputted by the low-pass filter 4 is then converted into a digital signal by an A/D converter 7.

The impedance converter 3 comprises an emitter-follower circuit including a transistor 8 and a resistor 9. The impedance observed at an input terminal 4a of the low-pass filter 4 looking at the output impedance of the impedance converter 3 is approximately the output impedance of the impedance converter 3 in parallel with the output impedance of the demodulator 2 divided by the gain of the transistor 8. Thus, the output impedance at the emitter of the transistor 8 is considerably lower than the output impedance of the demodulator 2. For example, when the demodulator 2 has an output impedance of 5 kΩ, the impedance of the resistor is 1 kΩ, and the current gain of the transistor 8 is 100, the output impedance at the emitter of the transistor 8 is about 50Ω. Since this output impedance (observed at the input terminal 4a of the low-pass filter 4) decreases, when the demodulated baseband analog signal is input to the low-pass filter 4, the noise at the low-pass filter 4 accordingly decreases as well. As a result of this, the C/N is improved.

Generally, to increase the N/F of a low-pass filter, the impedance on the side of the signal source (i.e. the filter input) should be less than the equivalent noise resistance on the side of a load (i.e. the filter output). In the present invention, as described above, by providing the impedance converter 3 as a signal source for the low-pass filter 4, the output impedance on the side of the signal source becomes less than the equivalent noise resistance on the side of the load. As a result of this, the C/N of the low-pass filter 4 is improved.

This application herein claims priority from and incorporates by reference Japanese Patent Application No. 11-114910, filed Apr. 22, 1999.

While the invention has been described with reference to specific embodiments, the description is illustrative of the invention and not to be construed as limiting the invention. Various modifications and applications may occur to those skilled in the art without departing from the true spirit and scope of the invention as defined in the appended claims.

What is claimed is:

1. A baseband analog circuit comprising:
   a demodulator to demodulate a received signal and to output a baseband analog signal, said demodulator having an output impedance;
   a low-pass filter to filter the demodulated baseband analog signal; and
   an impedance converter provided between said demodulator and said low-pass filter, said demodulator connected with an input of said impedance converter and said low-pass filter connected with an output of said impedance converter, said impedance converter so connected having a smaller output impedance than the output impedance of an unconnected demodulator,
   wherein said output impedance of said impedance converter is not greater than an equivalent noise resistance of said low-pass filter.

2. A baseband analog circuit according to claim 1, said impedance converter comprising an emitter-follower circuit.

3. A baseband analog circuit according to claim 1, said low-pass filter comprising complementary metal-oxide semiconductor (CMOS) circuitry.

4. A baseband analog circuit comprising:
   a demodulator to demodulate a received signal and to output a baseband analog signal, said demodulator having an output impedance;
   a low-pass filter to filter the demodulated baseband analog signal; and
   an emitter-follower circuit provided between said demodulator and said low-pass filter, said demodulator connected with a base of said emitter-follower circuit and said low-pass filter connected with an emitter of said emitter-follower circuit, said emitter-follower circuit so connected having a smaller output impedance than the output impedance of an unconnected demodulator, the output impedance of said emitter-follower circuit being not greater than an equivalent noise resistance of said low-pass filter.

5. A method of decreasing noise in a baseband analog circuit comprising:
   demodulating a received signal and outputting a baseband analog signal using a demodulator;
   decreasing an output impedance of said demodulator with an impedance converter connected with said demodulator to below that of an output impedance of an unconnected demodulator;
   low-pass filtering the demodulated baseband analog signal using a low-pass filter, said impedance converter provided between said demodulator and said low-pass filter; and
   limiting said output impedance of said impedance converter to not greater than an equivalent noise resistance of said low-pass filter.

6. The method of claim 5 further comprising providing an emitter-follower circuit to decrease the output impedance of said demodulator, said emitter-follower circuit provided such that an input of said emitter-follower circuit is connected with an output of said demodulator and an output of said emitter-follower circuit is connected with an input of said low-pass filter.

* * * * *